United States Patent
Heyman et al.

(10) Patent No.: US 10,283,898 B2
(45) Date of Patent: May 7, 2019

(54) ELECTRONIC DEVICE ENCLOSURES HAVING A MONOLITHIC APPEARANCE

(71) Applicant: Apple Inc., Cupertino, CA (US)

(72) Inventors: Ross C. Heyman, Belmont, CA (US); Alfredo Castillo, San Jose, CA (US); Arun R. Varma, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/974,185

(22) Filed: May 8, 2018

(65) Prior Publication Data

US 2019/0081431 A1    Mar. 14, 2019

Related U.S. Application Data

(60) Provisional application No. 62/556,270, filed on Sep. 8, 2017.

(51) Int. Cl.
| | |
|---|---|
| H05K 7/02 | (2006.01) |
| H05K 7/04 | (2006.01) |
| H01R 13/504 | (2006.01) |
| H05K 5/02 | (2006.01) |
| H01R 31/06 | (2006.01) |
| B29D 99/00 | (2010.01) |
| H02M 7/00 | (2006.01) |

(52) U.S. Cl.
CPC ......... *H01R 13/504* (2013.01); *H01R 31/065* (2013.01); *H05K 5/0247* (2013.01); *B29D 99/006* (2013.01); *H02M 7/003* (2013.01)

(58) Field of Classification Search
CPC .. H01R 13/504; H01R 31/065; H05K 5/0247; B29D 99/006
USPC .......................................................... 361/807
See application file for complete search history.

(56) References Cited

U.S. PATENT DOCUMENTS

| | | | |
|---|---|---|---|
| 7,508,682 B2* | 3/2009 | Badarinarayan ... | B23K 20/1265 361/752 |
| 9,882,302 B2 | 1/2018 | Kwan et al. | |
| 2005/0236372 A1* | 10/2005 | Moe .................... | B23K 20/028 219/101 |
| 2017/0291353 A1* | 10/2017 | Sagesaka ............ | B29C 65/1635 |

* cited by examiner

*Primary Examiner* — Hung S. Bui
(74) *Attorney, Agent, or Firm* — Kilpatrick Townsend and Stockton, LLP

(57) ABSTRACT

An enclosure for an AC to DC adapter has a continuous and apparently monolithic exterior appearance. The enclosure includes a housing and a cap that are joined together by one or more weld joints. The weld joints create flash on the exterior surface of the enclosure and the flash is removed by forming a chamfer along the weld joint such that it removes a portion of the housing and the cap.

20 Claims, 9 Drawing Sheets

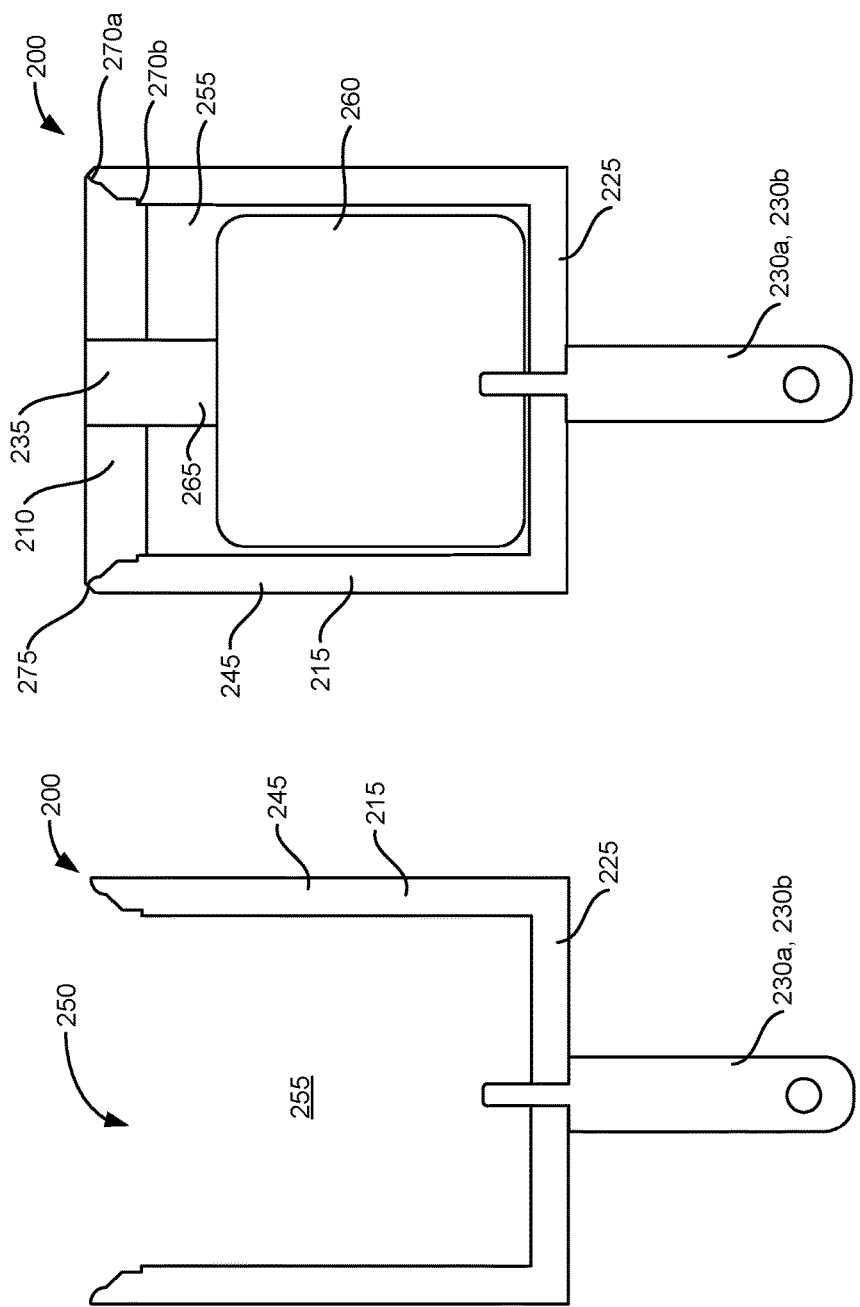

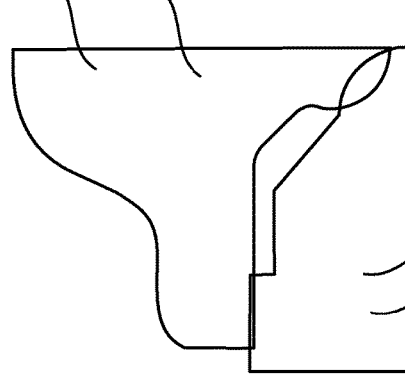
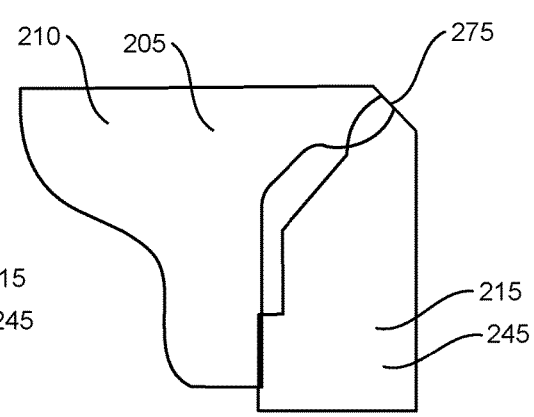
FIG. 8    FIG. 9
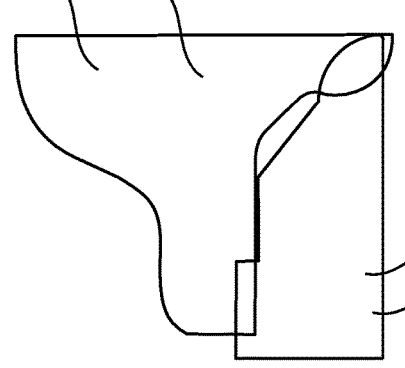
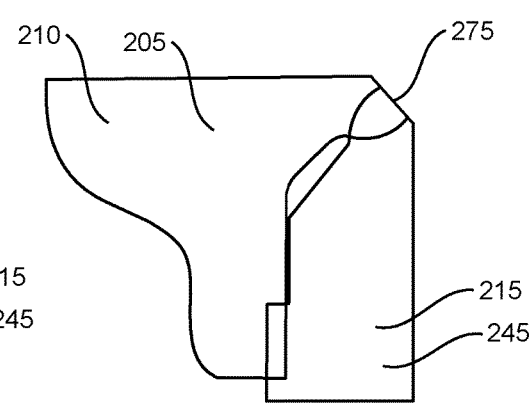
FIG. 10    FIG. 11

ELECTRONIC DEVICE ENCLOSURES HAVING A MONOLITHIC APPEARANCE

CROSS-REFERENCES TO OTHER APPLICATIONS

This application claims priority to U.S. provisional patent application Ser. No. 62/556,270, for "ELECTRONIC DEVICE ENCLOSURES HAVING A MONOLITHIC APPEARANCE" filed on Sep. 8, 2017 which is hereby incorporated by reference in entirety for all purposes.

FIELD

The described embodiments relate generally to enclosures that are made of two or more components and have the appearance of being monolithic. More particularly, the present embodiments relate to plastic enclosures that appear seamless and house one or more electronics assemblies.

BACKGROUND

Currently there are a wide variety of electronic devices that have enclosures to facilitate the use of the electronic device and provide an aesthetic appearance. However, often such enclosures have one or more seams where plastic components of the enclosure meet. The seams can disrupt the exterior surface of the enclosure impairing its aesthetics and sometimes creating a relatively weak region of the enclosure that is prone to damage and separation. This can be particularly problematic for enclosures that contain high-voltage electronic components that would be exposed if such a seam were to be broken. New enclosures are needed for electronic assemblies that are seamless, or at least have the appearance of being seamless, and/or that have improved structural integrity.

SUMMARY

Some embodiments of the present disclosure relate to enclosures having a monolithic look and feel that are used to encase an electronic assembly. While various embodiments of the disclosure can be used to encase many different types of electronic devices or assemblies, some specific embodiments relate to an enclosure that can be used for an AC to DC adapter. Additionally, while embodiments of the disclosure can be used with enclosures made from a variety of different materials, some embodiments are particularly useful for enclosure made from a plastic or similar material.

In some embodiments an enclosure for an electronic assembly having a seamless exterior appearance comprises a housing including a bottom wall and at least one side wall extending from the bottom wall, the at least one side wall having a distal end portion and an interior surface opposite an exterior surface. A cap comprises an outer surface opposite an inner surface and a perimeter region coupled to the distal end portion of the at least one side wall wherein the cap, the bottom wall, and the at least one side wall define a cavity sized and shaped to accommodate the electronic assembly. A first weld joint is formed between the distal end portion and the perimeter region and is located adjacent the exterior surface of the housing and the outer surface of the cap. A second weld joint is formed between the distal end portion and the perimeter region and is located adjacent the interior surface of the housing and the inner surface of the cap, wherein the first weld joint and the second weld joint define a central flash trap. A chamfer is formed along a length the first weld joint and extends across a portion of the exterior surface of the housing and a portion of the outer surface of the cap.

In some embodiments the central flash trap includes welding flash from the first and the second weld joints. In various embodiments the central flash trap is further defined by the at least one side wall and the cap. In some embodiments the first weld joint is formed along an entire perimeter of the at least one side wall and an entire perimeter region of the cap such that a liquid-tight interface is formed between the housing and the cap.

In some embodiments the enclosure further comprises an interior flash trap defined by the second weld joint, the interior surface of the at least one side wall and the inner surface of the cap. In various embodiments the electronic assembly comprises an AC to DC converter. In some embodiments the cap includes an aperture sized to receive a DC connector from the electronic assembly.

In some embodiments an enclosure for an electronic assembly has a seamless exterior appearance and comprises a housing including a bottom wall and at least one side wall extending from the bottom wall, the at least one side wall having a distal end portion and an interior surface opposite an exterior surface. A cap comprises an outer surface opposite an inner surface, and a perimeter region coupled to the distal end portion of the at least one side wall, wherein the cap, the bottom wall, and the at least one side wall define a cavity sized and shaped to accommodate the electronic assembly. A first weld joint is formed between the distal end portion and the perimeter region and is located adjacent the exterior surface of the housing and the outer surface of the cap. A second weld joint is formed between the distal end portion and the perimeter region and is located adjacent the interior surface of the housing and the inner surface of the cap. The second weld joint, the interior surface of the at least one side wall and the inner surface of the cap define an interior flash trap that contains welding flash from the second weld joint.

In some embodiments the first weld joint is formed along an entire perimeter of the at least one side wall and an entire perimeter region of the cap such that a liquid-tight interface is formed between the housing and the cap.

In various embodiments the enclosure further comprises a central flash trap defined by the first and the second weld joints, the cap and the at least one side wall. In some embodiments the central flash trap includes welding flash from the first and the second weld joints. In various embodiments the enclosure further comprises a polished region formed along a length the first weld joint and extending across a portion of the exterior surface of the housing and a portion of the outer surface of the cap.

In some embodiments the first weld joint is not visible when viewing an exterior of the enclosure. In various embodiments the electronic assembly is an AC to DC converter. In some embodiments at least two electrical prongs extend through the bottom wall and are coupled to the AC to DC converter. In some embodiments an electrical connector extends through the cap and is coupled to the AC to DC converter.

In some embodiments a method of forming an electronic device having a seamless exterior appearance comprises forming a housing having a bottom wall and at least one side wall extending from the bottom wall, the at least one side wall including a distal end portion having a curved tip, and wherein the bottom wall is formed around at least two electrical prongs extending through the bottom wall. An electronic assembly is disposed within the housing such that the electronic assembly is electrically coupled to the at least two electrical prongs. A cap is positioned on the housing such that the curved tip of the at least one sidewall is in contact with a curved profile of a perimeter region of the cap. A first weld joint is formed between the distal end portion of the at least one side wall and the perimeter region of the cap, wherein the cap, the bottom wall, and the at least one side wall define a cavity in which the electronic assembly positioned thereby forming a first flash formation on an exterior portion of the first weld joint and a second flash formation on an interior portion of the first weld joint. A chamfer is formed along a length the first weld joint such that the first flash formation, a portion of the housing and a portion of the cap are removed.

In some embodiments the first weld joint is formed by ultrasonic welding. In various embodiments the method further comprises forming a second weld joint between the at least one side wall and the cap simultaneously with forming the first weld joint. In some embodiments the first and second weld joints are separated by a flash trap that receives flash from the first and the second weld joints.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIG. 3 is a cross-sectional view of a housing for the AC to DC adapter illustrated in FIG. 2;

FIG. 4 is a cross-sectional view of an enclosure encasing an electronic assembly for the AC to DC adapter illustrated in FIG. 2;

FIGS. 8-11 illustrate tolerance variations between the cap and the housing for the enclosure illustrated in FIG. 2;

DETAILED DESCRIPTION

Some embodiments of the present disclosure relate to electronic devices that have a plastic enclosure that has the appearance and feel of being made from a monolithic material (e.g., appearing to be made from a unitary piece of material and not including any seams or joints indicating that multiple separate components have been joined together). Various embodiments relate to enclosures that can also have improved structural integrity at the enclosure edges and/or resiliency to water or dust penetration at interfaces where two or more components have been joined to form the enclosure. While the present disclosure can be useful for a wide variety of configurations, some embodiments of the disclosure are particularly useful for high voltage electronic assemblies encased in plastic enclosures, as described in more detail below.

For example, in some embodiments an injection molded plastic housing is formed having a cavity configured to receive an electronic assembly. A cap is welded to the housing over the cavity such that the enclosure fully encases the electronic assembly. Weld flash from the welding operation can appear on an exterior surface of the enclosure at the weld joint formed between the cap and the housing. A chamfer is formed along the weld joint to remove the weld flash, forming a visually continuous exterior surface at the weld joint where the housing and cap meet. In some embodiments the housing and the cap can be welded together to form a liquid-tight enclosure for an electronic device, such as an underwater diving device, that needs to be protected from liquid ingression.

In other embodiments an aesthetically pleasing AC to DC adapter can be made using a similar process. An injection molded plastic housing is formed with a cavity and a pair of AC wall adapter prongs that extend out of a face of the housing. An AC to DC converter assembly that includes high voltage circuitry is installed within the cavity and coupled to the prongs. A cap is installed over the cavity and welded to the housing. A chamfer is formed along the weld forming a visually continuous exterior surface at the seams where the cap is joined to the housing. The cap has an aperture through which a DC connector can be coupled to the AC to DC converter.

In order to better appreciate the features and aspects of housings having a monolithic appearance according to the present disclosure, further context for the disclosure is provided in the following section by discussing two particular implementations of electronic devices according to embodiments of the present disclosure. These embodiments are for example only and other embodiments can be employed in other electronic devices such as, but not limited to computers, watches, media players, wireless electronic devices, RFID tags and other devices.

Figure 1:
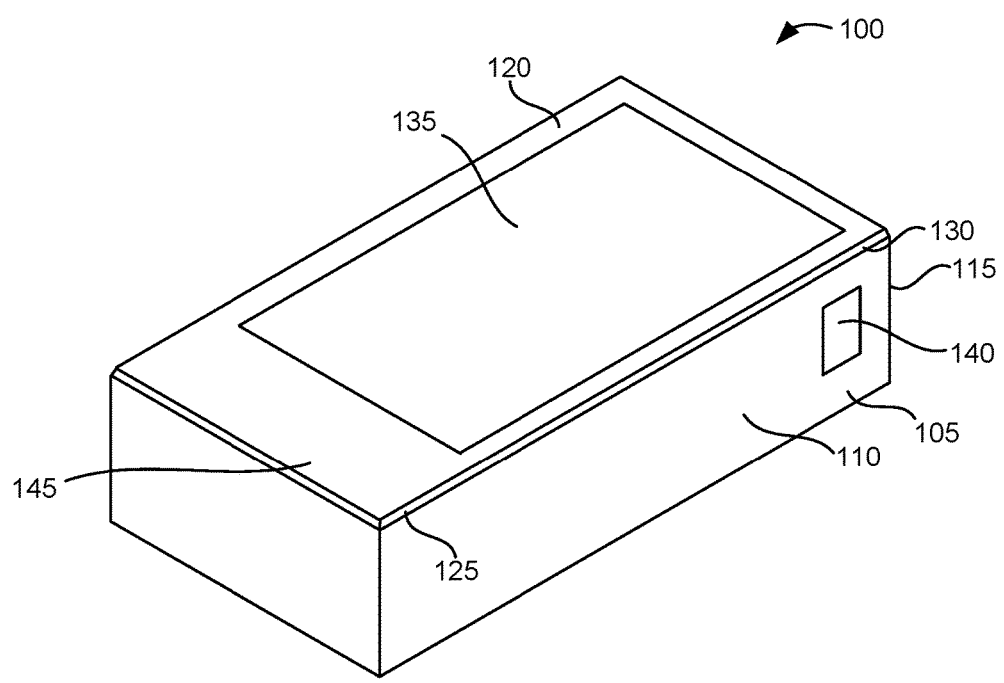
FIG. 1 is a front perspective view of an electronic device having a monolithic exterior appearance according to embodiment s of the disclosure.

FIG. 1 illustrates a simplified perspective view of an electronic device 100, that can be used for example as an underwater diving device, according to some embodiments of the disclosure. As shown in FIG. 1, electronic device 100 has an enclosure 105 with a visually continuous exterior surface 110 having the appearance and feel of being monolithic and seamless while also being liquid-tight. More specifically, enclosure 105 includes a housing 115 and a cap 120 that are visually continuous at a seam 125 where the housing and cap meet. The seamless appearance can be aesthetically pleasing, and can also provide resilience to dust and liquid penetration to the interior of electronic device 100. Further, seam 125 can be imperceptible to a user's touch giving electronic device 100 a smooth and monolithic feel. In some embodiments seam 125 can be formed to have sufficient mechanical strength so that cap 120 cannot be easily separated from housing 115 and edges 130 of enclosure 105 resist fracturing.

In the embodiment shown in FIG. 1, enclosure 105 is illustrated as including a display 135 (e.g., a touch display) and an input button 140 however other embodiments can have different user interface features. Since enclosure 105 has an undisrupted exterior surface, in some embodiments the electronic assembly within the enclosure can be inductively charged with an external and separate inductive charging station such that no penetrations are required through enclosure 105. In further embodiments enclosure 105 can have a battery or other power source within it. Embodiments of the disclosure are not limited to any particular electronic device. In some embodiments enclosure 105 can be used for electronic devices that have different components and/or features than those shown in FIG. 1.

For example, in some embodiments enclosure 105 can be used to enclose electronics assemblies such as, but not limited to, a smartphone, a tablet computer, a laptop or other type of computer, a watch, a wireless communication transceiver, a wireless router, an RFID device, a wirelessly activated tag for locating lost keys or an AC to DC adapter, as explained in more detail below. In one example, enclosure 105 can be used to encase a wireless transceiver, a rechargeable battery and a wireless charging interface to charge the battery. The enclosure can be formed without penetrations through the enclosure so the internal electronic assembly is fully encased and protected from water, moisture, dust or other environmental contaminants. In further embodiments, enclosure 105 can be used for purposes other than enclosing an electronic device. In one example, enclosure 105 can be used to form an aesthetically appealing enclosure for an antique (e.g., a coin or a piece of ancient artwork) that needs to be protected from damage and/or exposure to the environment.

As defined herein, liquid-tight shall mean a seal that conforms to one or more of the following ratings as defined by the International Protection Rating and International Electrochemical Commission (IEC) 60529 that can also be known as the I.P. 68 rating. In some embodiments the liquid-tight seal will protect the electronic assembly against the harmful ingress of water and have a "liquid ingress" rating between 1 (dripping water) and 8 (immersion beyond 1 meter). In various embodiments the liquid-tight seal shall be rated between 1 (dripping water) and 4 (splashing water) while in some embodiments the liquid-tight seal shall be rated between 2 (dripping water with device tilted at 15 degrees) and 5 (water jet). In various embodiments the liquid-tight seal shall be rated between 3 (spraying water) and 6 (powerful water jets) while in some embodiments the liquid-tight seal shall be rated between 4 (splashing water) and 7 (immersion up to 1 meter). In various embodiments the liquid-tight seal shall be rated between 5 (water jets) and 8 (immersion beyond 1 meter) while in some embodiments liquid-tight shall mean the seal will protect the electronic device against liquid ingress up to 100 feet for 30 minutes.

Figure 2:
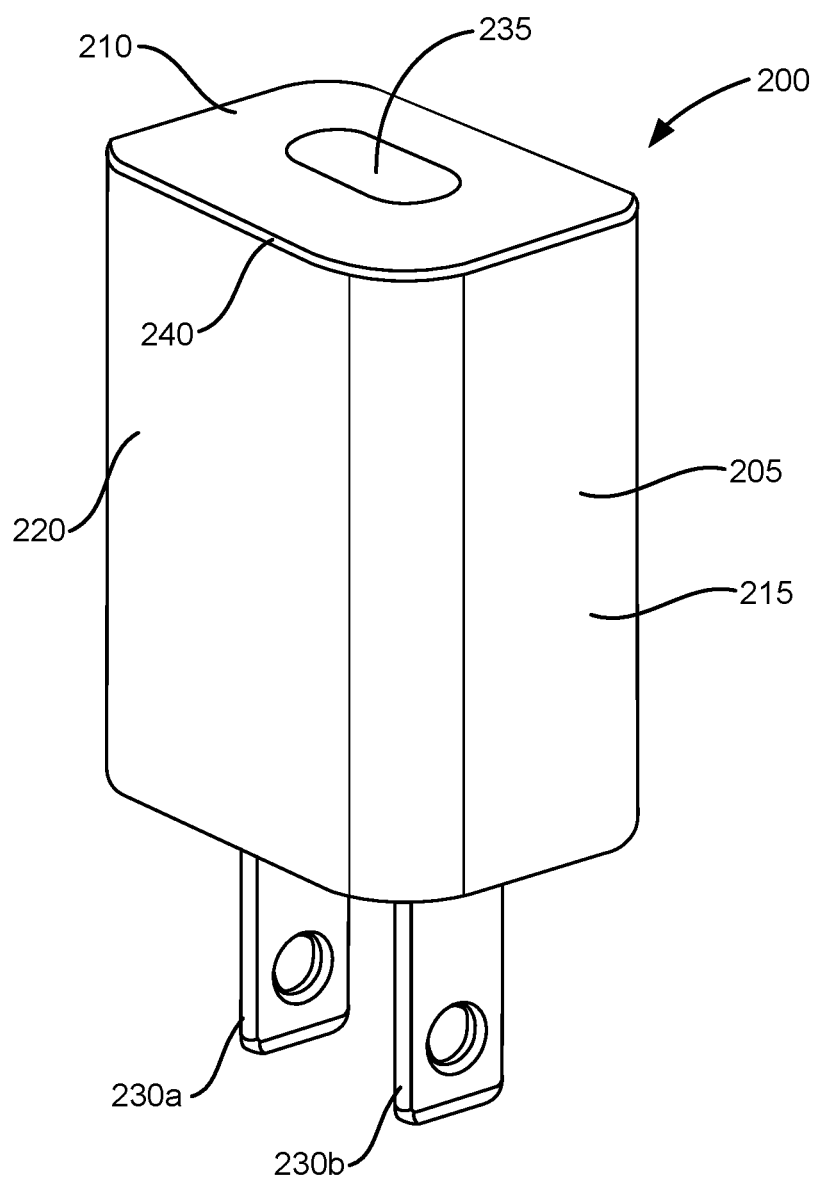
FIG. 2 is a front perspective view of an AC to DC adapter having a monolithic exterior appearance according to embodiments of the disclosure.

Now referring to FIG. 2 a simplified perspective view of an electronic device 200 comprising an AC to DC adapter having an enclosure with a seamless and monolithic appearance is illustrated. As shown in FIG. 2, electronic device 200 can be a plug-in AC to DC adapter that has an enclosure 205 including a cap 210 secured to a housing 215 forming a visually continuous exterior surface 220. In this embodiment, enclosure 205 encases an AC to DC electronics assembly (not shown in FIG. 2), as discussed in more detail below.

Electronic device 200 has a pair of metallic electrical prongs 230a, 230b that are configured to be plugged into an AC wall outlet to receive AC power. A receiving opening 235 in cap 210 is configured to receive a mating connector that can couple DC energy to an external electronic device. In some embodiments continuous exterior surface 220 can provide electronic device 200 with a pleasing appearance or feel for a user since housing 215 is not distinguishable from cap 210 by touch or by visual perception. In further embodiments one or more welds 240 formed between cap 210 and housing 215 can be configured to provide improved structural integrity such that enclosure 205 is able to withstand high mechanical forces.

FIGS. 3 and 4 illustrate simplified cross-sectional views of sequential steps associated with forming electronic device 200 illustrated in FIG. 2. As shown in FIG. 3, housing 215 includes a bottom wall 225 and at least one side wall 245 extending between bottom wall 225 and an opening 250, forming a cavity 255. In the embodiment illustrated in FIG. 2, housing 215 includes four sidewalls, however in other embodiments housing 215 can be cylindrically shaped such that there is only one side wall having a round cross section. Bottom wall 225 can be formed around at least two electrical prongs 230a, 230b that are disposed through bottom wall 225 (note, second prong 230b is disposed directly behind first prong 230a). More specifically, in some embodiments two electrical prongs 230a, 230b can be insert molded within housing 215. In other embodiments at least two electrical prongs 230a, 230b can be inserted after the formation of housing 215. Bottom wall 225 and at least one side wall 245 can be formed from an insulative plastic, such as a polycarbonate, and can be fabricated with an injection molding process. In one embodiment the insulative plastic material can be unfilled, while in other embodiments it can have between 1 percent and 20 percent glass fiber or other reinforcement.

Now referring to FIG. 4, a simplified cross-sectional view of electronic device 200 shown in FIG. 2 is illustrated with electronic assembly 260 disposed within the enclosure and cap 210 attached to housing 215. As shown in FIG. 4 electronic assembly 260 including AC to DC power conversion circuitry has been inserted within cavity 255 and electrically coupled to at least two electrical prongs 230a, 230b. A connector 265 can extend out of electronic assembly 260 and be used to supply DC power to a separate electronic device. More specifically, in some embodiments at least two electrical prongs 230a, 230b are configured to plug into an alternating current (AC) receptacle and provide AC power to electronic assembly 260. Electronic assembly 260 can then convert the AC energy to DC energy that is supplied to connector 256. In further embodiments digital communications data can also be transferred between at least two electrical prongs 230a, 230b, electronic assembly 260 and connector 265. In some embodiments, connector 265 can be a USB or other type of electrical connector, such as, but not limited to a USB Type-A connector, a USB micro connector or a USB Type-C connector.

Cap 210 can be formed to fit within opening 250 as discussed in more detail below and can be made from the same material as housing 215 using an injection molding process. For example, cap 210 can be formed from plastic, such as a filled or unfilled polycarbonate. Cap 210 can include an opening 235 aligned with connector 265. Connector 265 can be configured to couple to a mating connector of an external electronic device.

Cap 210 can be welded to housing 215 using an ultrasonic welding process. Ultrasonic welding involves applying high-frequency (e.g., in the range of 10 kHz to 40 kHz) acoustic vibrations to work pieces held together under pressure to create a solid-state weld. To install cap 210 onto housing 215 as shown in FIG. 4, cap 210 can be positioned on housing 215 followed by an application of force on the cap towards bottom wall 225 in combination with the application of ultrasonic vibrations to the cap and/or housing 215. The vibrations cause heat to be generated at the interfaces where cap 210 and housing 215 are in contact with each other as a result of the friction between the surfaces. The heat causes localized regions of cap 210 and housing 215 to melt and form first and second weld joints 270a, 270b, respectively, as discussed in more detail below. At each of first and second weld joints 270a, 270b, respectively, flash is generated that is extruded out of the weld, as described in more detail below. In order for enclosure 205 to have the appearance of being monolithic and seamless, a chamfer 275 can be formed along a length first weld joint 270a such that weld flash formed on the exterior surface of enclosure 205, a portion of the exterior surface of the housing 215 and a portion of the outer surface of cap 210 are removed. Although two weld joints are discussed in this example embodiment, some embodiments can have fewer or more weld joints.

Figure 5:
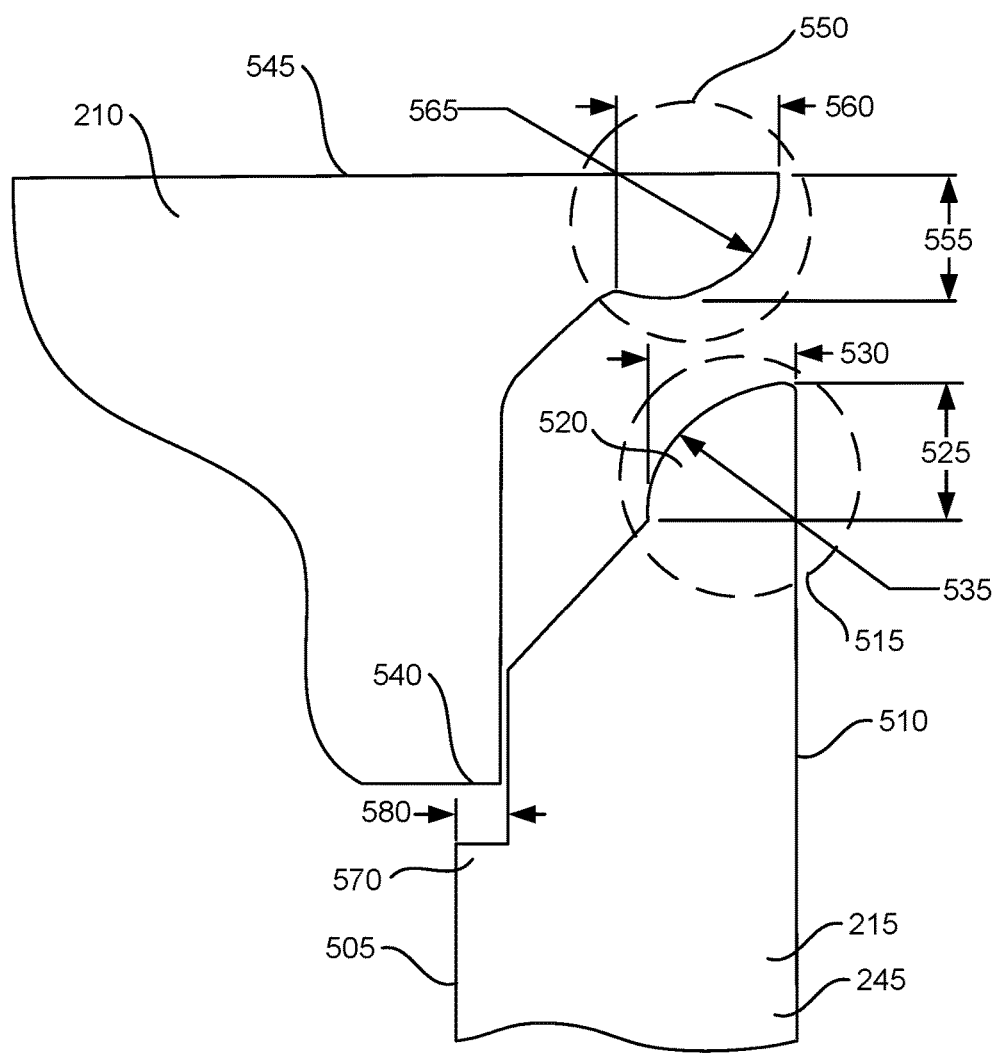
FIG. 5 is a cross-sectional close-up view the interface between the housing and a cap of the enclosure illustrated in FIG. 2A.
Figure 6:
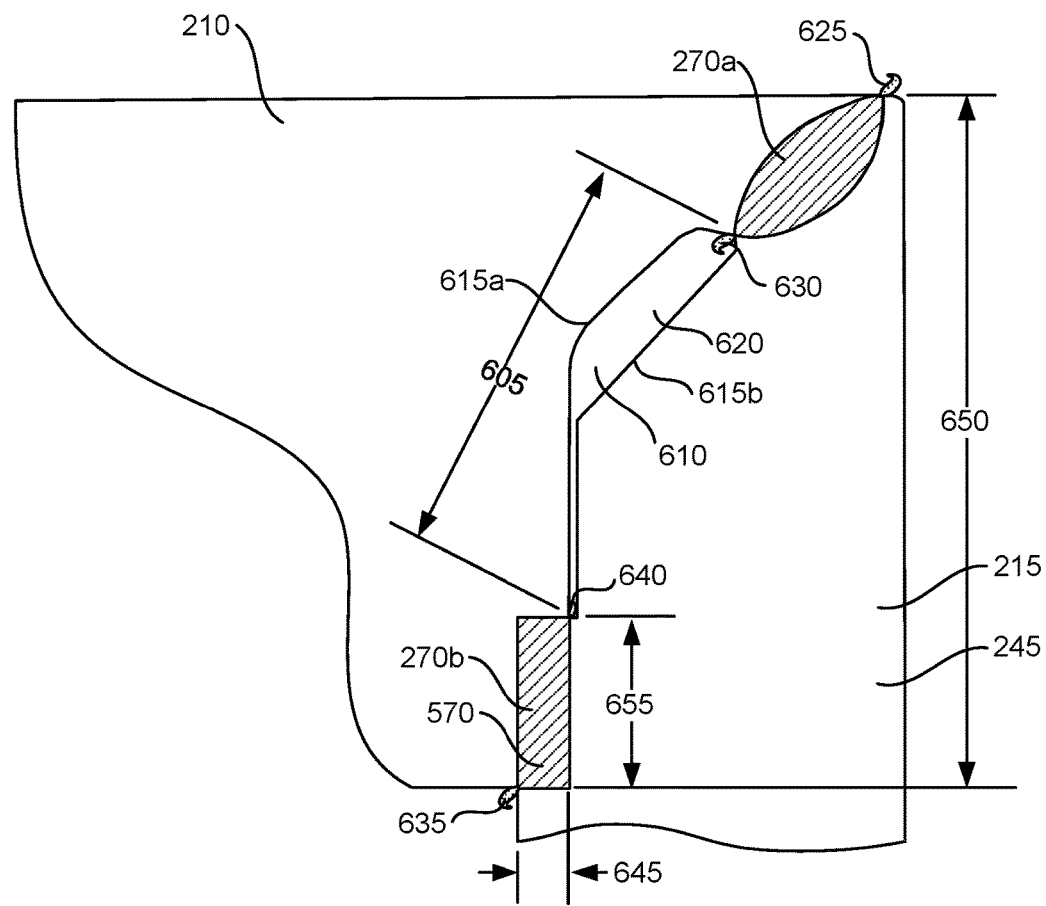
FIG. 6 is a cross-sectional close-up view of the post-weld interface between the housing and the cap illustrated in FIG. 5.
Figure 7:
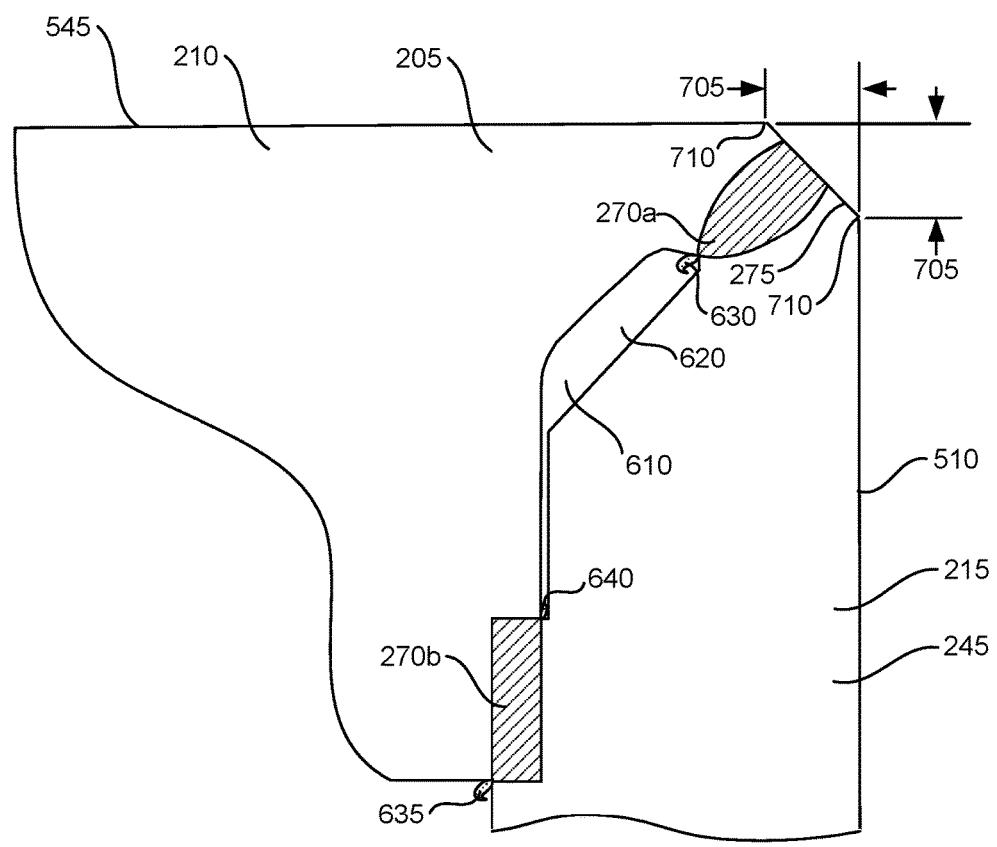
FIG. 7 is a cross-sectional close-up view of the enclosure illustrated in FIG. 6 after forming a chamfer.

FIGS. 5-7 illustrate simplified cross-sectional close-up views of first and second weld joints 270a, 270b, respectively, before, during and after the welding process described above. As shown in FIG. 5, cap 210 and housing 215 are illustrated in a pre-welding position. Housing 215 has at least one side wall 245 comprising an interior surface 505 opposite and adjacent an exterior surface 510 and a distal end portion 515 with a curved tip 520. In some embodiments curved tip 520 has a height 525 that is between 0.5 and 1.6 millimeters while in other embodiments it is between 0.7 and 1.4 millimeters and in some embodiments is between 1.0 and 1.1 millimeters. In some embodiments curved tip 520 has a width 530 that is between 0.4 and 1.3 millimeters while in other embodiments it is between 0.6 and 1.1 millimeters and in some embodiments is between 0.8 and 0.9 millimeters. In some embodiments curved tip 520 has a radius 535 that is between 0.5 and 1.0 millimeters while in other embodiments it is between 0.6 and 0.9 millimeters and in some embodiments is between 0.70 and 0.8 millimeters. In various embodiments radius 535 may continue such that width 530 is reduced in a transition region where curved tip 520 transitions to the remainder of housing 215. In some embodiments width 530 can be reduced in the transition region between 0.02 and 0.09 millimeters while in other embodiments it is reduced between 0.03 and 0.07 millimeters and in some embodiments is reduced between 0.04 and 0.06 millimeters Cap 210 includes an inner surface 540 opposite and adjacent an outer surface 545 and has a perimeter region 550 with a curved profile. In some embodiments perimeter region 550 has a height 555 that is between 0.5 and 1.5 millimeters while in other embodiments it is between 0.7 and 1.0 millimeters and in some embodiments is between 0.80 and 0.90 millimeters. In some embodiments perimeter region 550 has a width 560 that is between 0.5 and 1.5 millimeters while in other embodiments it is between 0.7 and 1.3 millimeters and in some embodiments is between 0.9 and 1.1 millimeters. In some embodiments perimeter region 550 has a radius 565 that is between 0.5 and 1.5 millimeters while in other embodiments it is between 0.75 and 1.25 millimeters and in some embodiments is between 0.90 and 1.0 millimeters.

At least one side wall 245 can include a protrusion 570 that interferes with a bottom portion 575 of cap 210. The region of interference can create second weld joint 270b (see FIG. 4). In some embodiments protrusion 570 can protrude from one or more side walls a distance 580 that is between 0.10 and 0.5 millimeters and in some embodiments is between 0.2 and 0.4 millimeters and in further embodiments is between 0.25 and 0.35 millimeters.

As shown in FIG. 6, cap 210 and housing 215 are illustrated in a post-welding position. First and second weld joints 270a, 270b, respectively, have been formed. First and second weld joints 270a, 270b, respectively, are separated by a distance 605 and have a non-interference region 610 between them formed by a pair surfaces 615a, 615b that have a straight portion and a sloped portion. In other embodiments non-interference region 610 can have a different shape. In some embodiments distance 605 is between 1.0 and 3.0 millimeters while in other embodiments it is between 1.5 and 2.5 millimeters and in some embodiments is between 1.7 and 2.3 millimeters. Non-interference region 610 creates a central flash trap 620 that is a cavity defined by cap 210, side wall 245, first weld joint 270a and second weld joint 270b. More specifically, during ultra-sonic welding, weld flash (e.g., material that extrudes from the weld joint in the region of the weld) can form around first and second weld joints 270a, 270b, respectively, from the melt and flow of the plastic material under pressure.

First weld joint 270a can form a first flash formation 625 on an exterior portion of the first weld joint and a second flash formation 630 on an interior portion of the first weld joint. Second flash formation 630 can be formed in central flash trap 620 such that it doesn't interfere with cap 210 bonding to housing 215. Similarly, second weld joint 270b can form a third flash formation 635 on an interior of enclosure 205 that may be called an interior flash trap, and a fourth flash formation 640 formed in central flash trap 620. Therefore, central flash trap 620 can provide a cavity to accommodate flash formed by first and second weld joints 270a, 270b, respectively. Although central flash trap 620 is shown as one particular shape in the embodiments disclosed herein, it is not limited to such a shape and can any shape and may also exist as one or more cavities internal to the interface formed between cap 210 and housing 215 that accommodate flash from one or more weld joints. Further, although two weld joints are disclosed in the embodiments described herein, in other embodiments only a single first weld joint 270a can be used.

Second weld joint 270b can be formed by shear forces placed on the interference region that includes protrusion 570 described above during ultrasonic welding. In some embodiments height 655 of second weld joint 270b can be between 0.5 and 1.5 millimeters while in other embodiments it is between 0.7 and 1.0 millimeters and in some embodiments is between 0.80 and 0.90 millimeters. In some embodiments width 645 of second weld joint 270b can be between 0.05 and 1.0 millimeters, and in some embodiments is between 0.10 and 0.55 millimeters and in further embodiments is between 0.25 and 0.35 millimeters. In some embodiments thickness 650 of cap 210 can be between 2.0 and 6.0 millimeters, and in some embodiments is between 3.0 and 5.0 millimeters and in further embodiments is between 4.0 and 4.4 millimeters.

As shown in FIG. 7, a chamfer 275 is formed along a length first weld joint 270a such that first flash formation 625 (see FIG. 6), a portion of housing 215 and a portion of cap 210 are removed, resulting in a seamless exterior appearance. More specifically, if first flash formation 625 were not removed it would show evidence of welding and negatively affect the aesthetic monolithic look and feel of enclosure 205. By forming chamfer 275 that removes a portion of housing 215 and a portion of cap 210 the visible evidence of the welding operation is removed providing enclosure 205 with an aesthetically appealing exterior that is apparently monolithic and seamless. That is, cap 210 and housing 215 appear to be uniform without seams or welds between them by forming chamfer 275 along a length the first weld joint such that the chamfer extends across a portion of exterior surface 510 of the housing and across a portion of the outer surface 545 of the cap.

By selecting an appropriate dimension for chamfer 275, tolerance variations between cap 210 and housing 215 can also be accommodated, as explained in more detail below. In some embodiments chamfer 275 distance 705 is between 0.1 and 0.8 millimeters and in other embodiments is between 0.2 and 0.6 millimeters and in further embodiments is between 0.3 and 0.5 millimeters. In some embodiments the longitudinal edges 710 of the chamfer can be rounded to form a smoother exterior surface. In various embodiments instead of a chamfer a radius, a profile, a spline or any other geometry can be formed in place of the chamfer to remove first flash formation 625 (see FIG. 6), a portion of housing 215 and a portion of cap 210, resulting in a seamless exterior appearance. In some embodiments a polishing process can be used to create a polished region in place of chamfer 275 such that first flash formation 625 is removed and the corner is rounded and polished instead of chamfered.

In some embodiments chamfer 275 can be formed by a post machining process while in other embodiments it can be formed by grinding, cutting including laser and abrasive water jet, skiving or any other process. In various embodiments a post chamfer formation polishing process can be used to further unify the appearance of enclosure 205. Example polishing processes are tumbling, sanding, etching and abrasive media polishing.

FIGS. 8-11 illustrate tolerance variations between cap 210 and housing 215. As shown in FIGS. 8-11 chamfer 275 described above can be used to accommodate tolerance variations such that housing 215 and cap 210 form an aesthetically appealing monolithic appearance regardless of the allotted size variation for each part.

Now referring to FIG. 8, a minimum material condition tolerance scenario is shown in which cap 210 is at the small end of the allowed tolerance and at least one sidewall 245 of housing 215 is at the large end of the allowed tolerance. FIG. 9 illustrates the structure of FIG. 8 after forming chamfer 275. As shown in FIG. 9, chamfer 275 still removes, a portion of housing 215 and a portion of cap 210, resulting in a seamless exterior appearance.

Now referring to FIG. 10, a maximum material condition tolerance scenario is shown in which cap 210 is at the large end of the allowed tolerance and at least one sidewall 245 of housing 215 is at the small end of the allowed tolerance. FIG. 11 illustrates the structure of FIG. 10 after forming chamfer 275. As shown in FIG. 11, chamfer 275 still removes, a portion of housing 215 and a portion of cap 210, resulting in a seamless exterior appearance.

Figure 12:
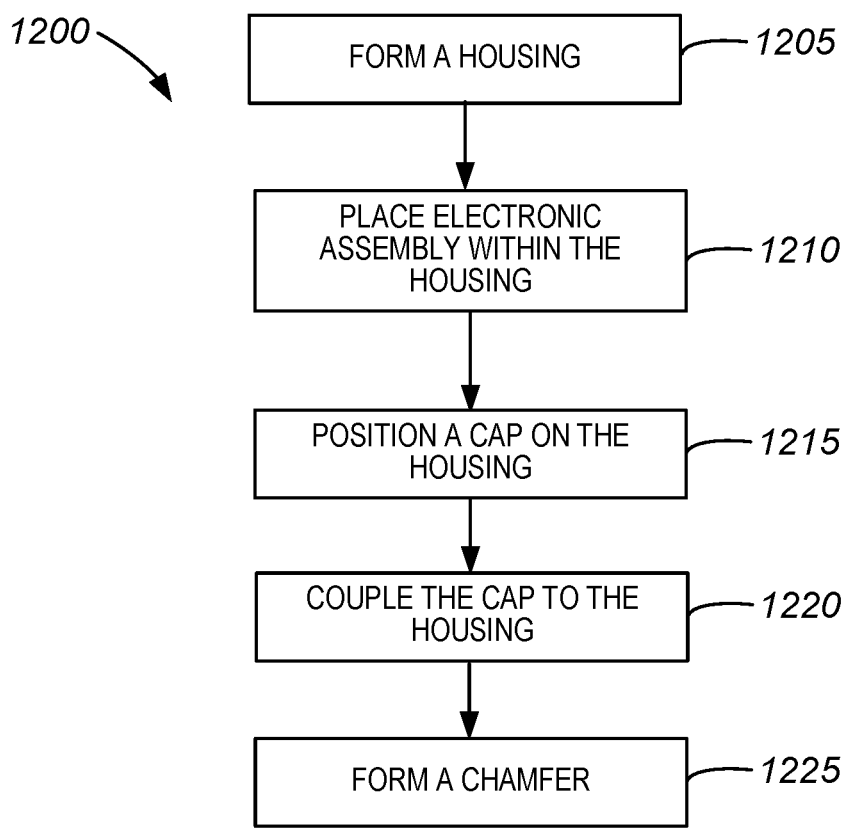
FIG. 12 is a method of forming an AC to DC adapter having an enclosure with a monolithic appearance according to embodiments of the disclosure.

FIG. 12 illustrates a method of forming an AC to DC adapter having an apparently seamless and monolithic enclosure, such as enclosure 105 or 205 illustrated in FIGS. 1 and 2, respectively. In step 1205 a housing is formed. In some embodiments the housing has a bottom wall and at least one side wall extending from the bottom wall. The side wall includes a distal end portion with a curved tip. The bottom wall is formed around at least two electrical prongs extending through the bottom wall.

In step 910 an electronics assembly is placed within the housing. The electronics assembly is electrically coupled to the at least two electrical prongs. In step 915 a cap is positioned on the housing such that it encases the electronics assembly. The cap includes an inner surface opposite and adjacent an outer surface and has a perimeter region with a curved profile.

In step 920 the perimeter region of the cap is coupled to the curved tip of the sidewall of the housing such that the cap, the bottom wall, and the at least one side wall define a cavity in which the electronic assembly is enclosed. In some embodiments a first and a second weld joint are formed wherein the first weld joint is positioned proximate an exterior of the enclosure and a second weld joint is positioned proximate an interior of the enclosure. In further embodiments only the first weld is formed that is positioned proximate the exterior of the enclosure.

In some embodiments the coupling is formed by ultrasonically welding the cap to the housing. During the welding process the first weld joint can form a first flash formation on an exterior portion of the first weld joint and a second flash formation on an interior portion of the first weld joint. The second flash formation can be formed in a central flash trap that is formed by a gap between the cap and the housing such that the second flash formation doesn't interfere with the cap bonding to the housing. Similarly, the second weld joint can form a third flash formation on an interior of the enclosure and a fourth flash formation in the central flash trap.

In step 1225 a chamfer is formed along a length of the first weld joint such that the first flash formation, a portion of the housing and a portion of the cap are removed, resulting in a seamless exterior appearance of the enclosure.

Figure 13:
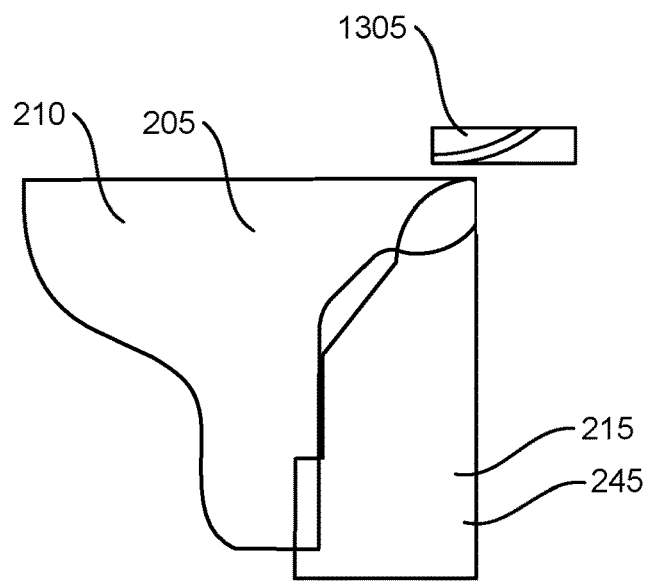
FIG. 13 is a cross-sectional close-up view of the enclosure illustrated in FIG. 6 after removing welding flash.

FIG. 13 illustrates a simplified cross-sectional close-up view of housing 215 and cap 210 after flash removal. As shown in FIG. 13, in one embodiment an end mill 1305 or other tool can be used to remove first flash formation 625 (see FIG. 6) around a perimeter of enclosure 205 resulting in a seamless exterior appearance. By removing first flash formation 625 (see FIG. 6) the visible evidence of the welding operation is removed providing enclosure 205 with an aesthetically appealing exterior that is apparently monolithic and seamless. That is, cap 210 and housing 215 appear to be uniform without seams or welds between them. In some embodiments end mill 1305 can be equipped with a bearing or other device that allows it to precisely trim first flash formation 625 (see FIG. 6) without marring or damaging housing 215 and/or cap 210.

Figure 14:
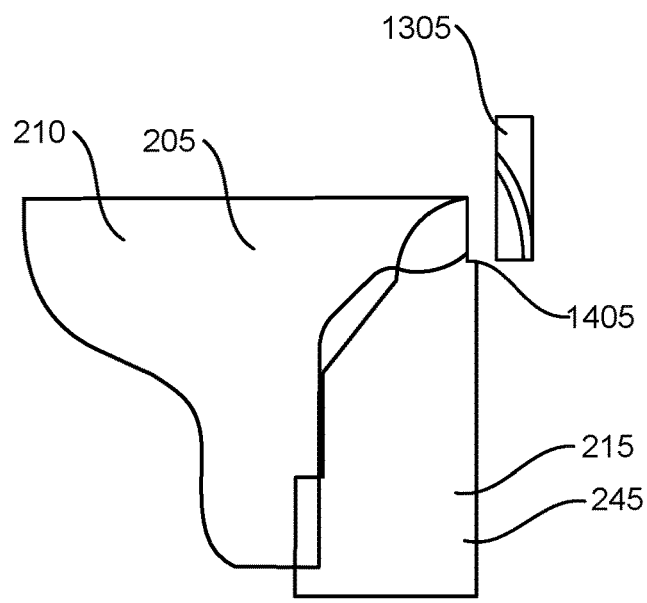
FIG. 14 is a cross-sectional close-up view of the enclosure illustrated in FIG. 6 after removing welding flash by forming a step.

FIG. 14 illustrates a simplified cross-sectional close-up view of housing 215 and cap 210 after flash removal. As shown in FIG. 14, in one embodiment an end mill 1305 or other tool can be used to form a step 1405 that removes first flash formation 625 (see FIG. 6) a portion of housing 215 and a portion of cap 210, resulting in a seamless exterior appearance. By removing first flash formation 625 (see FIG. 6) around a perimeter of enclosure 205 the visible evidence of the welding operation is removed providing the enclosure with an aesthetically appealing exterior that is apparently monolithic and seamless. That is, cap 210 and housing 215 appear to be uniform without seams or welds between them.

Although electronic devices 100 and 200 (see FIGS. 1 and 2, respectively) are described and illustrated as two particular electronic devices, embodiments of the disclosure are suitable for use with a multiplicity of electronic devices. For example, any device that encloses an electrical assembly can be used with embodiments of the invention.

In some instances, embodiments of the disclosure are particularly well suited for use with portable electronic devices because of the importance of their aesthetic appearance. As used herein, an electronic media device includes any device with at least one electronic component. Such devices can include, for example, portable music players (e.g., MP3 devices and Apple's iPod devices), portable video players (e.g., portable DVD players), cellular telephones (e.g., smart telephones such as Apple's iPhone devices), wireless routers, video cameras, digital still cameras, projection systems (e.g., holographic projection systems), gaming systems, PDAs, as well as tablet (e.g., Apple's iPad devices), laptop or other mobile computers. Some of these devices can be configured to provide audio, video or other data or sensory output.

Although electronic devices 100 and 200 (see FIGS. 1 and 2, respectively) are described and illustrated as having a cap that is welded to a housing wall that is orthogonal to the cap, embodiments of the disclosure are suitable for use with other orientations of components. For example, in some embodiments an electronic device can have two walls that are positioned parallel, coplanar and adjacent one another that need to be joined together into a monolithic planar wall. The two walls can be joined together as shown above in FIG. 6 where a first wall is aligned such that it is partly overlapping the second wall and pushed down during welding forming a joint between the two walls. In another embodiment the two walls can be arranged parallel, and co-planar with each other such that the first wall is pushed horizontally into the second wall during the welding process. When the first wall is joined to the second wall a joint similar to that illustrated in FIG. 6 can be formed. The flash that forms on the external portion of the weld joint can be removed in any number of ways including lapping, polishing or any other method such that the two walls become monolithic in their appearance. Other orientations of components can be similarly joined together and evidence of the joining process can be removed, giving the two components the appearance of being monolithic.

For simplicity, various internal components, such as the AC to DC power conversion circuitry, bus, memory, storage device and other components of electronic devices 100 and 200 (see FIGS. 1 and 2A, respectively) are not shown in the figures.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. An enclosure for an electronic assembly, the enclosure having a seamless exterior appearance and comprising:
    a housing including a bottom wall and at least one side wall extending from the bottom wall, the at least one side wall having a distal end portion and an interior surface opposite an exterior surface;
    a cap comprising:
        an outer surface opposite an inner surface; and
        a perimeter region coupled to the distal end portion of the at least one side wall;
        wherein the cap, the bottom wall, and the at least one side wall define a cavity sized and shaped to accommodate the electronic assembly;
    a first weld joint formed between the distal end portion and the perimeter region and located adjacent the exterior surface of the housing and the outer surface of the cap;
    a second weld joint formed between the distal end portion and the perimeter region and located adjacent the interior surface of the housing and the inner surface of the cap, wherein the first weld joint, the second weld joint, the cap and the housing define a central flash trap; and
    a chamfer formed along a length of the first weld joint and extending across a portion of the exterior surface of the at least one side wall and a portion of the outer surface of the cap.

2. The enclosure of claim 1 wherein the central flash trap includes welding flash from the first and the second weld joints.

3. The enclosure of claim 1, wherein the central flash trap is defined by the at least one side wall of the housing and the cap.

4. The enclosure of claim 1 wherein the first weld joint is formed along an entire perimeter of the at least one side wall and an entire perimeter region of the cap such that a liquid-tight interface is formed between the housing and the cap.

5. The enclosure of claim 1 further comprising an interior flash trap defined by the second weld joint, the interior surface of the at least one side wall and the inner surface of the cap.

6. The enclosure of claim 1 wherein the electronic assembly comprises an AC to DC converter.

7. The enclosure of claim 1 wherein the cap includes an aperture sized to receive a DC connector from the electronic assembly.

8. An enclosure for an electronic assembly, the enclosure having a seamless exterior appearance and comprising:
    a housing including a bottom wall and at least one side wall extending from the bottom wall, the at least one side wall having a distal end portion and an interior surface opposite an exterior surface;
    a cap comprising:
        an outer surface opposite an inner surface; and
        a perimeter region coupled to the distal end portion of the at least one side wall;
        wherein the cap, the bottom wall, and the at least one side wall define a cavity sized and shaped to accommodate the electronic assembly;
    a first weld joint formed between the distal end portion and the perimeter region and located adjacent the exterior surface of the housing and the outer surface of the cap;

a chamfer formed along a length of the first weld joint and extending across a portion of the exterior surface of the at least one side wall and a portion of the outer surface of the cap; and a second weld joint formed between the distal end portion and the perimeter region and located adjacent the interior surface of the housing and the inner surface of the cap;

wherein the second weld joint, the interior surface of the at least one side wall and the inner surface of the cap define an interior flash trap that contains welding flash from the second weld joint.

9. The enclosure of claim 8 wherein the first weld joint is formed along an entire perimeter of the at least one side wall and an entire perimeter region of the cap such that a liquid-tight interface is formed between the housing and the cap.

10. The enclosure of claim 9 further comprising a central flash trap defined by the first and the second weld joints, the cap and the at least one side wall.

11. The enclosure of claim 10 wherein the central flash trap includes welding flash from the first and the second weld joints.

12. The enclosure of claim 9, further comprising a polished region formed along a length the first weld joint and extending across a portion of the exterior surface of the housing and a portion of the outer surface of the cap.

13. The enclosure of claim 8 wherein the first weld joint is not visible when viewing an exterior of the enclosure.

14. The enclosure of claim 8 wherein the electronic assembly is an AC to DC converter.

15. The enclosure of claim 14 wherein at least two electrical prongs extend through the bottom wall and are coupled to the AC to DC converter.

16. The enclosure of claim 14 wherein an electrical connector extends through the cap and is coupled to the AC to DC converter.

17. A method of forming an electronic device having a seamless exterior appearance, the method comprising:

forming a housing having a bottom wall and at least one side wall extending from the bottom wall, the at least one side wall including a distal end portion having a curved tip, and wherein the bottom wall is formed around at least two electrical prongs extending through the bottom wall;

disposing an electronic assembly within the housing such that the electronic assembly is electrically coupled to the at least two electrical prongs;

positioning a cap on the housing such that the curved tip of the at least one sidewall is in contact with a curved profile of a perimeter region of the cap; and forming a first weld joint between the distal end portion of the at least one side wall and the perimeter region of the cap, wherein the cap, the bottom wall, and the at least one side wall define a cavity in which the electronic assembly positioned thereby forming a first flash formation on an exterior portion of the first weld joint and a second flash formation on an interior portion of the first weld joint; and forming a chamfer along a length the first weld joint such that the first flash formation, a portion of the housing and a portion of the cap are removed.

18. The method of claim 17 wherein the first weld joint is formed by ultrasonic welding.

19. The method of claim 17 further comprising forming a second weld joint between the at least one side wall and the cap simultaneously with forming the first weld joint.

20. The method of claim 19 wherein the first and second weld joints are separated by a flash trap that receives flash from the first and the second weld joints.

* * * * *